United States Patent
Krug, Jr. et al.

(10) Patent No.: US 11,096,315 B2
(45) Date of Patent: *Aug. 17, 2021

(54) MULTIFUNCTION COOLANT MANIFOLD STRUCTURES

(71) Applicant: INTERNATIONAL BUSINESS MACHINES CORPORATION, Armonk, NY (US)

(72) Inventors: Francis R. Krug, Jr., Highland, NY (US); Randy J. Zoodsma, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/248,844

(22) Filed: Jan. 16, 2019

(65) Prior Publication Data

US 2019/0150325 A1    May 16, 2019

Related U.S. Application Data

(63) Continuation of application No. 15/825,735, filed on Nov. 29, 2017, now Pat. No. 10,271,464, which is a
(Continued)

(51) Int. Cl.
*H05K 7/20*    (2006.01)

(52) U.S. Cl.
CPC ................. *H05K 7/20781* (2013.01)

(58) Field of Classification Search
CPC ........... H05K 7/20781; H05K 7/20809; H05K 7/20818; H05K 7/20827; H05K 7/2029; H05K 7/208; H05K 7/20272; F01P 1/028
See application file for complete search history.

(56) References Cited

U.S. PATENT DOCUMENTS

| | | |
|---|---|---|
| 2,254,406 A | 9/1941 | Zarotschenzeff |
| 2,952,329 A | 9/1960 | Cunningham et al. |

(Continued)

OTHER PUBLICATIONS

Krug, Jr. et al., "Multifunction Coolant Manifold Structures", U.S. Appl. No. 16/145,301, filed Sep. 28, 2018 (44 pages).

(Continued)

*Primary Examiner* — Tho V Duong
(74) *Attorney, Agent, or Firm* — Tihon Poltavets, Esq.; Kevin P. Radigan, Esq.; Heslin Rothenberg Farley & Mesiti P.C.

(57) ABSTRACT

A cooling system is provided which includes, for instance, a coolant supply manifold, a multifunction coolant manifold structure, and multiple cooling structures. The multifunction coolant manifold structure includes a coolant-commoning manifold and an auxiliary coolant reservoir above and in fluid communication with the coolant-commoning manifold. The multiple cooling structures are coupled in parallel fluid communication between the coolant supply and coolant-commoning manifolds to receive coolant from the supply, and exhaust coolant to the coolant-commoning manifold. The coolant-commoning manifold is sized to slow therein a flow rate of coolant exhausting from the multiple cooling structures to allow gas within the exhausting coolant to escape the coolant within the coolant-commoning manifold. The escaping gas rises to the auxiliary coolant reservoir and is replaced within the coolant-commoning manifold by coolant from the auxiliary coolant reservoir.

9 Claims, 9 Drawing Sheets

Related U.S. Application Data continuation of application No. 14/828,754, filed on Aug. 18, 2015, now Pat. No. 9,854,713, which is a continuation of application No. 14/519,392, filed on Oct. 21, 2014, now Pat. No. 9,861,012.

(56) References Cited

U.S. PATENT DOCUMENTS

| | | | |
|---|---|---|---|
| 3,586,101 | A | 6/1971 | Chu et al. |
| 3,817,321 | A | 6/1974 | Von Cube et al. |
| 3,989,099 | A | 11/1976 | Hosono et al. |
| 4,027,728 | A | 6/1977 | Kobayashi et al. |
| 4,480,598 | A | 11/1984 | Berrigan |
| 4,680,001 | A | 7/1987 | Waters |
| 4,698,728 | A | 10/1987 | Tustaniwskyj et al. |
| 4,907,644 | A | 3/1990 | Ghiraldi |
| 5,406,807 | A * | 4/1995 | Ashiwake ............ H01L 23/427 165/908 |
| 6,325,297 | B1 | 12/2001 | Calvin et al. |
| 6,782,926 | B1 | 8/2004 | Hughes |
| 7,011,143 | B2 | 3/2006 | Corrado et al. |
| 7,310,738 | B2 | 12/2007 | Bhagwath et al. |
| 7,450,385 | B1 | 11/2008 | Campbell et al. |
| 7,469,551 | B2 | 12/2008 | Tilton et al. |
| 8,054,625 | B2 | 11/2011 | Noteboom et al. |
| 8,875,537 | B1 | 11/2014 | Utathin et al. |
| 9,101,078 | B2 * | 8/2015 | Campbell .......... H05K 7/20145 |
| 9,854,713 | B2 | 12/2017 | Krug, Jr. et al. |
| 9,861,012 | B2 | 1/2018 | Krug, Jr. et al. |
| 2004/0216613 | A1 | 11/2004 | Altmann |
| 2005/0173097 | A1 | 8/2005 | Kitajima et al. |
| 2006/0002086 | A1 | 1/2006 | Teneketges et al. |
| 2007/0012245 | A1 | 1/2007 | Park |
| 2007/0095505 | A1 | 5/2007 | Robinson |
| 2007/0193300 | A1 | 8/2007 | Tilton et al. |
| 2007/0209782 | A1 * | 9/2007 | Wyatt ................ F28D 15/0266 165/76 |
| 2010/0033923 | A1 | 2/2010 | Copeland et al. |
| 2012/0090348 | A1 * | 4/2012 | O'Rourke ........... H01M 10/625 62/434 |
| 2013/0327511 | A1 * | 12/2013 | Johnston ................ F28F 9/02 165/173 |
| 2014/0076524 | A1 | 3/2014 | Boday et al. |
| 2014/0126151 | A1 | 5/2014 | Campbell et al. |
| 2014/0202678 | A1 | 7/2014 | Goth et al. |
| 2014/0238065 | A1 | 8/2014 | Bonnin et al. |
| 2018/0084677 | A1 | 3/2018 | Krug, Jr. et al. |
| 2018/0084678 | A1 | 3/2018 | Krug, Jr. et al. |

OTHER PUBLICATIONS

Krug, Jr. et al., "Multifunction Coolant Manifold Structures", U.S. Appl. No. 16/248,839, filed Jan. 16, 2019 (44 pages).

Krug, Jr. et al., "Multifunction Coolant Manifold Structures", U.S. Appl. No. 16/248,841, filed Jan. 16, 2019 (40 pages).

Krug, Jr. et al., "List of IBM Patents and/or Patent Applications Treated as Related", U.S. Appl. No. 16/248,844, filed Jan. 16, 2019, dated Jan. 16, 2019 (2 pages).

* cited by examiner

MULTIFUNCTION COOLANT MANIFOLD STRUCTURES

BACKGROUND

The power dissipation of integrated circuit chips, and the modules containing the chips, continues to increase in order to achieve increases in processor performance. This trend poses cooling challenges at the module, system, rack and data center levels.

In many large server applications, processors along with their associated electronics (e.g., memory, disk drives, power supplies, etc.) are packaged in removable drawer configurations stacked within an electronics rack or frame comprising information technology (IT) equipment. In other cases, the electronics may be in fixed locations within the rack or frame. Conventionally, the components have been cooled by air moving in parallel airflow paths, usually front-to-back, impelled by one or more air moving assemblies (e.g., axial or centrifugal fans). In some cases it has been possible to handle increased power dissipation within a single drawer or system by providing greater airflow, for example, through the use of more powerful air moving assemblies or by increasing the rotational speed (i.e., RPMs) of the fan mechanisms. However, this approach is becoming problematic, particularly in the context of a computer center installation (i.e., data center).

The sensible heat load carried by the air exiting the rack(s) is stressing the capability of the room air-conditioning to effectively handle the load. This is especially true for large installations with "server farms" or large banks of computer racks located close together. In such installations, liquid-cooling is an attractive technology to selectively manage the higher heat fluxes. The liquid absorbs the heat dissipated by the components/modules in an efficient manner. Typically, the heat is ultimately transferred from the liquid coolant to a heat sink, whether air or other liquid-based.

SUMMARY

The shortcomings of the prior art are addressed and additional advantages are provided through the provision, in one aspect, of a method which includes providing a cooling system. Providing the cooling system includes providing a coolant loop including a coolant, and providing a heat exchange assembly coupled to the coolant loop to cool coolant within the coolant loop. Further, providing the cooling system includes providing a coolant supply manifold coupled to the coolant loop, and providing a multifunction coolant manifold structure to deaerate the coolant. The multifunction coolant manifold structure is coupled to the coolant loop and is separate from the heat exchange assembly. The multifunction coolant manifold structure includes a coolant-commoning manifold, an auxiliary coolant reservoir disposed above and in fluid communication with the coolant-commoning manifold, and a coolant fill port within the auxiliary coolant reservoir, below a top of the auxiliary coolant reservoir to assist in defining a gas pocket in an upper portion thereof as a coolant expansion region. Further, providing the cooling system includes providing multiple cooling structures coupled to the coolant loop in parallel fluid communication between the coolant supply manifold and the coolant-commoning manifold to receive coolant from the coolant supply manifold, and exhaust coolant to the coolant-commoning manifold. The multifunction coolant manifold structure includes both the coolant-commoning manifold and a coolant distribution manifold portion integrated together in a single structure, where the multifunction coolant manifold structure is sized larger than the coolant supply manifold. The multifunction coolant manifold structure deaerates the coolant by the coolant-commoning manifold being sized larger than the coolant supply manifold to slow therein a flow rate of coolant exhausting from the multiple cooling structures as the coolant enters the coolant-commoning manifold to allow gas within the exhausting coolant to escape the coolant within the coolant-commoning manifold. The escaping gas within the coolant-commoning manifold rises to the auxiliary coolant reservoir, and is replaced within the coolant-commoning manifold by coolant from the auxiliary coolant reservoir.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
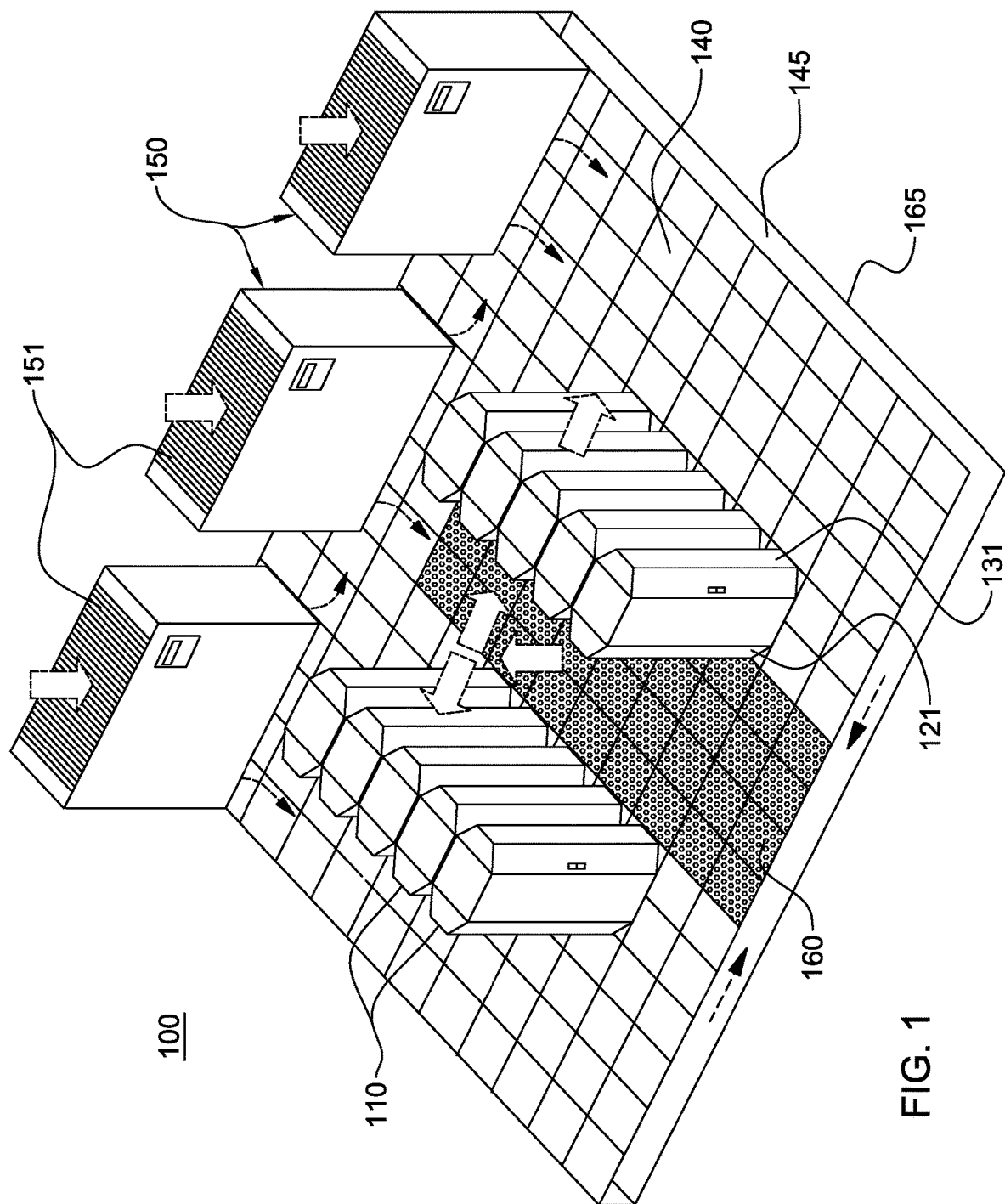
FIG. 1 depicts one embodiment of a raised floor layout of an air-cooled data center, which may employ one or more cooling systems, in accordance with one or more aspects of the present invention.

As used herein, the terms "electronics rack" and "rack unit" are used interchangeably, and unless otherwise specified include any housing, frame, rack, compartment, blade server system, etc., having one or more heat-generating components of a computer system, electronic system, information technology (IT) equipment, etc., and may include, for example, a stand-alone computer processor having high-, mid- or low-end processing capability. In one embodiment, an electronics rack may comprise a portion of an electronic system, a single electronic system, or multiple electronic systems, for example, in one or more subsystems, sub-housings, blades, drawers, nodes, compartments, boards, etc., having one or more heat-generating electronic components disposed therein or thereon. An electronic system may be movable or fixed, for example, relative to an electronics rack, with rack-mounted electronic drawers of a rack unit and blades of a blade center system being two examples of electronic systems of an electronics rack to be cooled. In one embodiment, an electronic system may comprise multiple electronic components, and may be, in one example, a server unit.

"Electronic component" refers to any heat generating electronic component of, for example, an electronic system requiring cooling. By way of example, an electronic component may comprise one or more integrated circuit die and/or other electronic devices to be cooled, including one or more processor die, memory die or memory support die. As a further example, an electronic component may comprise one or more bare die or one or more packaged die disposed on a common carrier. Further, unless otherwise specified herein, the term "coolant-cooled cold plate" refers to any conventional thermally conductive, heat transfer structure having a plurality of channels or passageways formed therein for flowing of coolant, such as liquid coolant, therethrough.

As used herein, "coolant-to-air heat exchanger" means any heat exchange mechanism characterized as described herein, across which air passes and through which coolant, such as liquid coolant, can circulate; and includes, one or more discrete heat exchangers, coupled either in series or in parallel. A coolant-to-air heat exchanger may comprise, for example, one or more coolant flow paths, formed of thermally conductive tubing (such as copper or other tubing) thermally coupled to a plurality of fins across which air passes. Size, configuration and construction of the coolant-to-air heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of the coolant is water. However, the concepts disclosed herein are readily adapted to use with other types of coolant. For example, the coolant may comprise a brine, a dielectric liquid, a fluorocarbon liquid, a liquid metal, or other coolant, or refrigerant, while still maintaining the advantages and unique features of the present invention.

Reference is made below to the drawings, wherein the same or similar reference numbers used throughout different figures designate the same or similar components.

As shown in FIG. 1, in one implementation of a raised floor layout of an air-cooled data center 100, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between a raised floor 140 and a base or sub-floor 165 of the room. Cooled air is taken in through louvered covers at air inlet sides 121 of the electronics racks and expelled through the back (i.e., air outlet sides 131) of the electronics racks. Electronics racks 110 may have one or more air-moving devices (e.g., axial or centrifugal fans) to provide forced inlet-to-outlet air flow to cool the electronic components within the rack units. The supply air plenum 145 provides (in one embodiment) conditioned and cooled air to the air-inlet sides of the electronics racks via perforated floor tiles 160 disposed in a "cold" aisle of the computer installation. The cooled air is supplied to plenum 145 by one or more air conditioning units 150, also disposed within data center 100. Room air is taken into each air conditioning unit 150 near an upper portion thereof. This room air may comprise (in part) exhausted air from the "hot" aisles of the computer installation defined by opposing air outlet sides 131 of the electronics racks 110.

Figure 2:
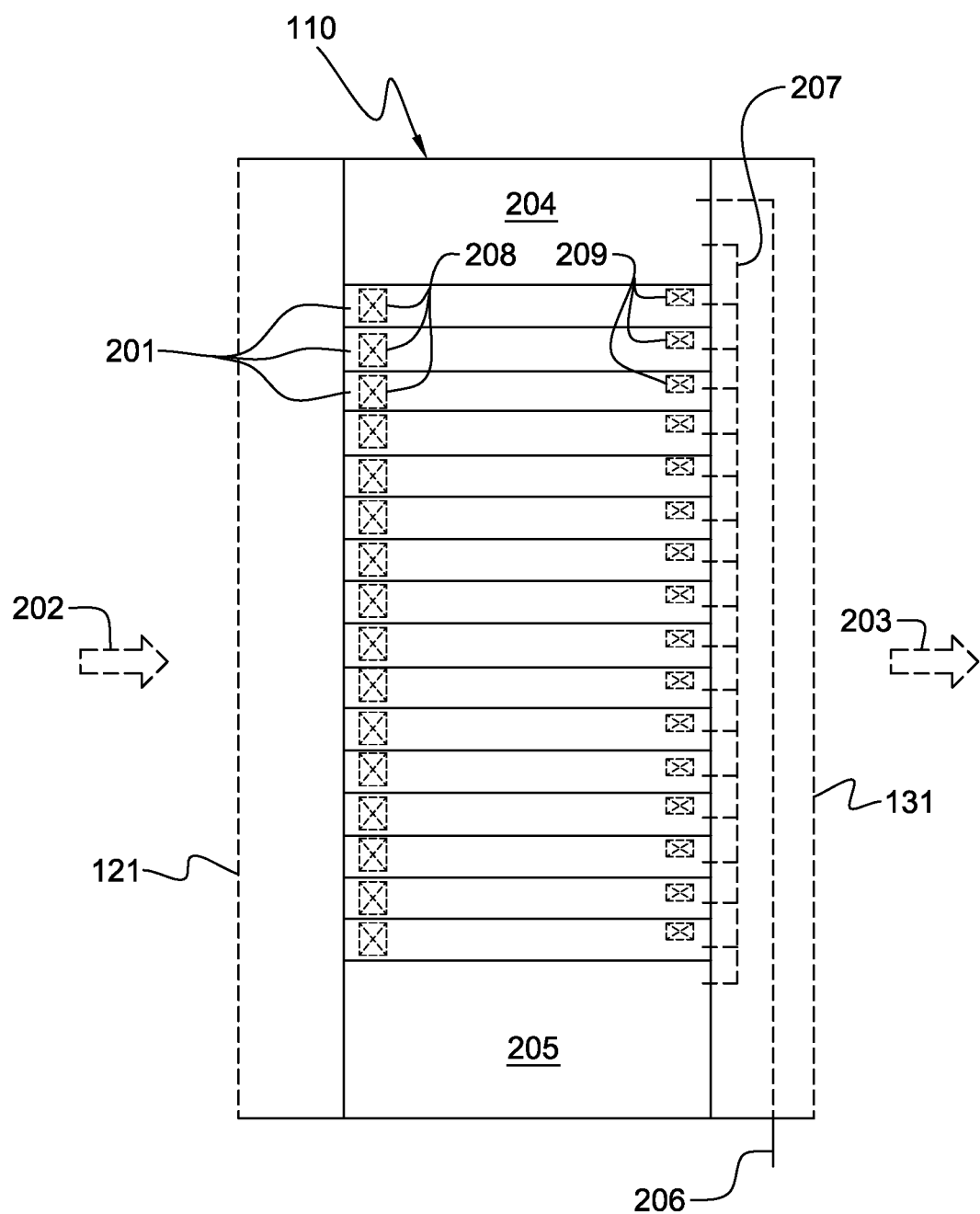
FIG. 2 is a cross-sectional elevational view of one implementation of an electronics rack for a data center, which may employ a cooling system, in accordance with one or more aspects of the present invention.

FIG. 2 depicts (by way of example) one embodiment of an electronics rack 110 with a plurality of electronic systems 201 to be cooled. In the embodiment illustrated, electronic systems 201 are air-cooled by cool airflow 202 ingressing via air inlet side 121, and exhausting out air outlet side 131 as heated airflow 203. By way of example, one or more air-moving assemblies 208 may be provided at the air inlet sides of electronic systems 201 and/or one or more air-moving assemblies 209 may be provided at the air outlet sides of electronic systems 201 to facilitate airflow through the individual systems 201 as part of the cooling apparatus of electronics rack 110. For instance, air-moving assemblies 208 at the air inlets to electronic systems 201 may be or include axial fan assemblies, while air-moving assemblies 209 disposed at the air outlets of electronic systems 201 may be or include centrifugal fan assemblies. One or more electronic systems 201 may include heat-generating components to be cooled of, for instance, an electronic subsystem, and/or information technology (IT) equipment. More particularly, one or more of the electronic systems 201 may include one or more processors and associated memory.

In one embodiment, electronics rack 110 may also include, by way of example, one or more bulk power assemblies 204 of an AC to DC power supply assembly. AC to DC power supply assembly further includes, in one embodiment, a frame controller, which may be resident in the bulk power assembly 204 and/or in one or more electronic systems 201. Also illustrated in FIG. 2 is one or more input/output (I/O) drawer(s) 205, which may also include a switch network. I/O drawer(s) 205 may include, as one example, PCI slots and disk drivers for the electronics rack.

In the depicted implementation, a three-phase AC source feeds power via an AC power supply line cord 206 to bulk power assembly 204, which transforms the supplied AC power to an appropriate DC power level for output via distribution cable 207 to the plurality of electronic systems 201 and I/O drawer(s) 205. The number of electronic systems installed in the electronics rack is variable, and depends on customer requirements for a particular system. Note that the particular electronics rack 110 configuration of FIG. 2 is presented by way of example only, and not by way of limitation. In particular, FIGS. 3A-6B depict, in part, other alternate implementations of an electronics rack and cooling approaches.

Figure 3A:
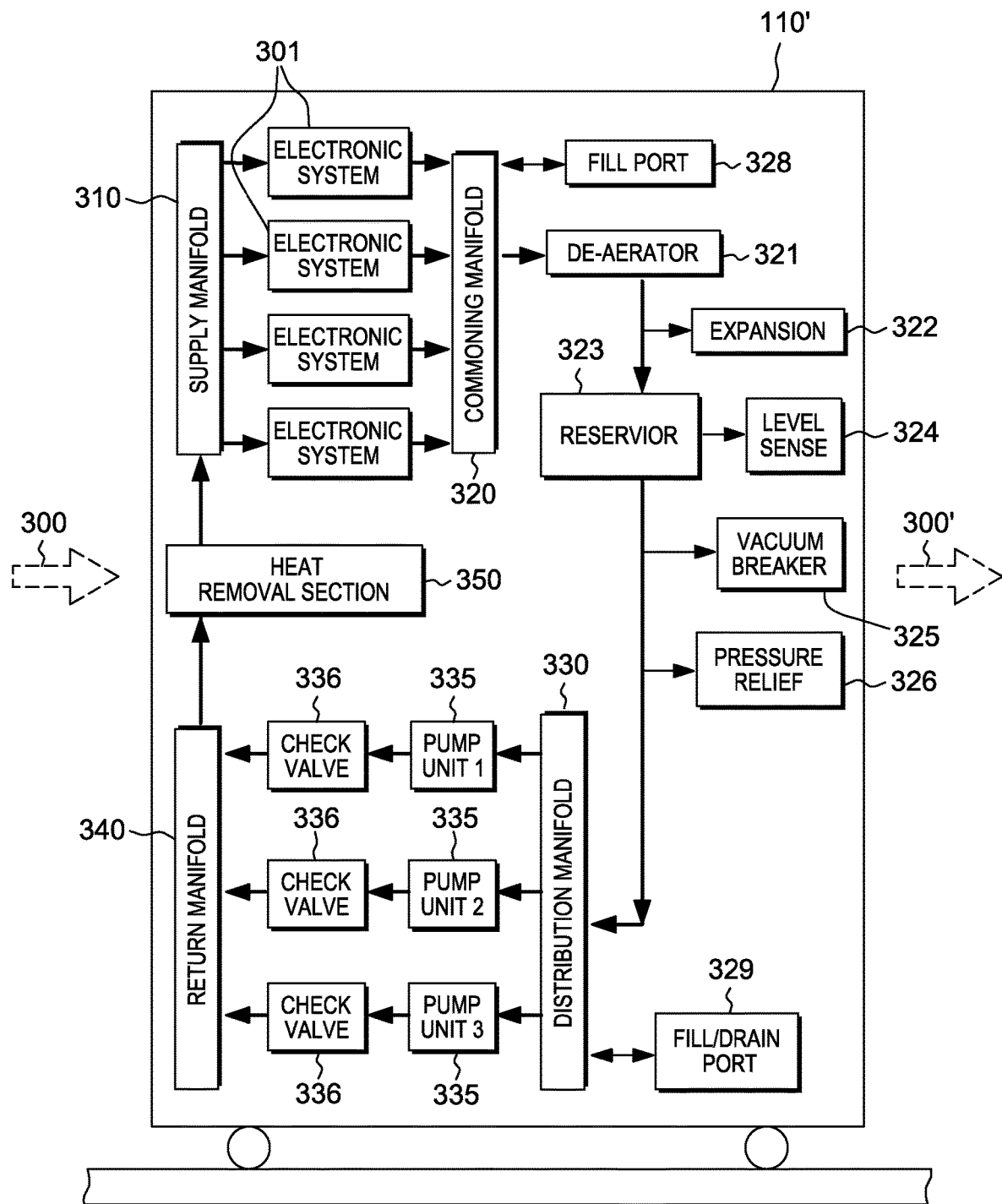
FIG. 3A is a schematic of one embodiment of a cooled electronics assembly having multiple electronic systems and a cooling system, in accordance with one or more aspects of the present invention.

Referring first to FIG. 3A, a schematic diagram is presented of one embodiment of a cooled electronic assembly configured as a cooled electronics rack 110', which includes multiple electronic systems 301 and a cooling system, which may be disposed fully or partially internal to the electronics rack, or in an alternate implementation, external, and even remote from the electronics rack. In the depicted implementation, electronic systems 301 each have an associated cooling structure (or heat removal structure) of the cooling system. By way of example, one or more of the cooling structures may comprise one or more coolant-cooled cold plates, or one or more coolant-immersion housings depending, for instance, whether indirect or direct liquid-assisted cooling is desired. The cooling system further includes a coolant supply manifold 310 and a coolant-commoning manifold 320, with the multiple cooling structures being coupled in parallel fluid communication between coolant supply manifold 310 and coolant-commoning manifold 320 to receive coolant from the coolant supply manifold, and exhaust coolant to the coolant-commoning manifold.

FIG. 3A depicts an example of a closed-loop cooling system, with multiple control and monitor components that allow the system to operate reliably. These components include one or more de-aerators 321 to remove dissolved gasses from the coolant, a coolant expansion structure 322 to accommodate expansion of coolant within the cooling system, a reservoir 323, one or more level sensors 324 associated with reservoir 323 to sense level of coolant within the cooling system, a vacuum breaker 325 coupled to the coolant loop of the cooling system to prevent cavitation of the pumping assembly, and a pressure-relieve valve 326 associated with the coolant loop to ensure that the cooling system does not over-pressurize. A fill port 328 may be provided at the top of the cooling system, and a drain port 329 may be provided in a lower portion of the cooling system. As shown, reservoir 323 functions to supply coolant to a distribution manifold 330 of a pumping assembly, which includes multiple pumping units 335, pump 1, pump 2, and pump 3, each with an associated check valve 336. Further, the pumping assembly includes a return manifold 340. As illustrated, the pumping units 335 of the pumping assembly are coupled in parallel fluid communication between distribution manifold 330 and return manifold 340. In one implementation, the pumping units 335 are modular pumping units (MPUs), which may be individually, selectively replaced concurrent with continued operation of the cooling system of the cooled electronic assembly depicted. Note that, in one implementation, the components of the cooling system of FIG. 3A are discrete components which fulfill the above-described functions.

As illustrated, the cooling system further includes a heat removal section 350, coupled in fluid communication between return manifold 340 of the pump assembly and coolant supply manifold 310. By way of example, heat removal section 350 includes one or more coolant-to-air heat exchangers with one or more associated fan mechanisms (e.g., axial or centrifugal fans) to facilitate air-cooling of coolant within the heat exchanger(s) by flowing cooled air 300 across heat removal section 350. After passing across heat removal section 350, the heated air egresses from the rack unit as heated air 300'. Note that in an alternate embodiment, the heat removal section could include one or more coolant-to-coolant heat exchangers, or one or more liquid-to-liquid heat exchangers, to reject heat from the coolant circulating through the cooling system. For instance, the heat could be rejected to facility-chilled water where available, rather than to cooled air 300.

In operation, heat generated within the electronic systems 301 is extracted by coolant flowing through (for example) respective cooling structures associated therewith, such as cold plates, and is returned via the coolant-commoning manifold 320 and the active modular pumping unit(s) (MPU) 335, for example, for rejection of the heat from the coolant to the cooled ambient air 300 passing across the heat exchanger in heat removal section 350. In one implementation, only one modular pumping unit 335 may (depending on the mode) be active at a time, and the MPU redundancy allows for, for example, servicing or replacement of an inactive modular pumping unit from the cooling system, without requiring shut-off of the electronic systems being cooled. By way of specific example, quick connect couplings may be employed, along with appropriately sized and configured hoses to couple, for example, the heat exchanger, cold plates, supply and return manifolds, reservoir and pumping units. Redundant fan mechanisms, such as redundant centrifugal fans, with appropriate, redundant drive cards or controllers, may be mounted to direct cooled air 300 across the heat exchanger(s) of the heat removal section. These controllers may be in communication with a system-level controller (not shown), in one embodiment. In one normal mode implementation, the multiple fan mechanisms may be running at the same time.

Auxiliary (or backup) air-cooling may be provided across the electronic systems 301, for instance, in the case of a failure of the coolant-based cooling apparatus which requires shut-off of coolant flow to the electronic systems 301. In such a case, airflow may be drawn through the rack from an air inlet side to an air outlet side thereof via redundant backup fan mechanisms (not shown) and appropriate airflow ducting. Note in this regard, that in one embodiment, the auxiliary airflow cooling apparatus may be disposed above the multiple electronic systems within the electronics rack, and the coolant-based cooling system discussed herein may be disposed below the multiple electronic systems to be cooled, as in the schematic of FIG. 3A.

Note that, although depicted with reference to FIG. 3A with respect to one or more coolant-to-air heat exchangers, the cooling system(s) disclosed herein may provide pumped coolant (such as water) for circulation through various types of heat exchange assemblies, including one or more coolant-to-air heat exchangers, one or more coolant-to-coolant heat exchangers, a rack-mounted door heat exchanger, a coolant-to-refrigerant heat exchanger, etc. Further, the heat exchange assembly may comprise more than one heat exchanger, including more than one type of heat exchanger, depending upon the implementation. The heat exchange assembly, or more generally, heat removal section, could be within the cooled electronics rack, or positioned remotely from the rack.

Figure 3B:
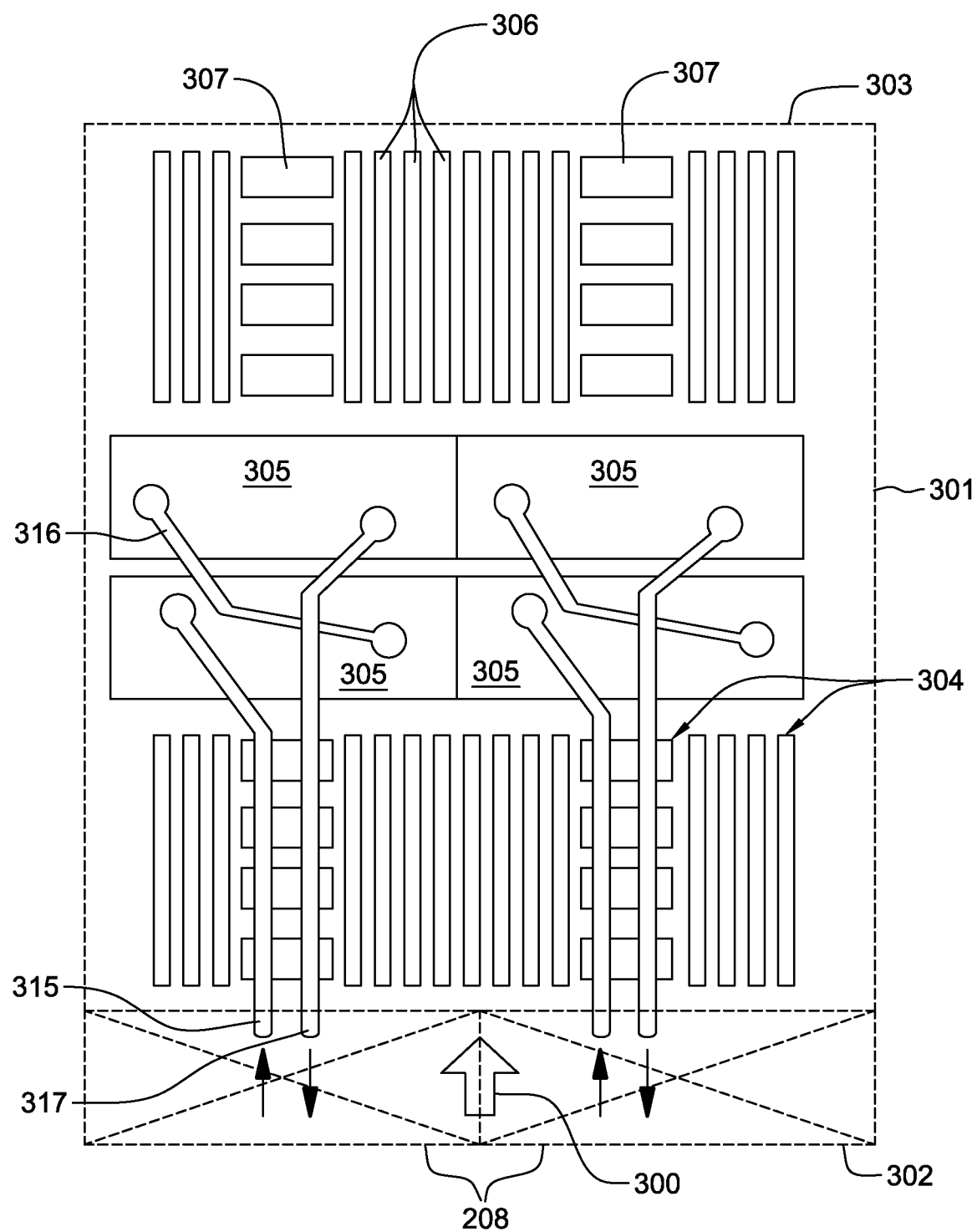
FIG. 3B is a plan view of one embodiment of an electronic system layout illustrating, by way of example, a hybrid cooling approach for cooling components of the electronic system using, in part, a cooling system, in accordance with one or more aspects of the present invention.

By way of example only, FIG. 3B depicts one embodiment of an electronic system 301 component layout wherein one or more air moving devices 208 provide forced air flow 300 to cool multiple components 304 within electronic system 301. Cool air is taken in through a front 302 and exhausted out a back 303 of the drawer. The multiple components to be cooled include multiple processor modules to which cooling structures, such as coolant-cooled cold plates 305 of the cooling system are coupled, as well as multiple arrays of memory modules 306 (e.g., dual in-line memory modules (DIMMs)) and multiple rows of memory support modules 307 (e.g., DIMM control modules) to which air-cooled heat sinks may be coupled. In the embodiment illustrated, memory modules 306 and memory support modules 307 are partially arrayed near front 302 of electronic system 301, and partially arrayed near back 303 of electronic subsystem 301. Also, in the embodiment of FIG. 3B, memory modules 306 and the memory support modules 307 are cooled by air flow 300 across the electronic system.

The illustrated coolant-based cooling system further includes multiple coolant-carrying tubes connected to and in fluid communication with coolant-cooled cold plates 305. The coolant-carrying tubes comprise sets of coolant-carrying tubes, with each set including (for example) a coolant supply tube 315, a bridge tube 316 and a coolant return tube 317. In this example, each set of tubes provides coolant to a series-connected pair of cold plates 305 (coupled to a pair of processor modules). Coolant flows into a first cold plate of each pair via the coolant supply tube 315 and from the first cold plate to a second cold plate of the pair via bridge tube or line 316, which may or may not be thermally conductive. From the second cold plate of the pair, coolant is returned through the respective coolant return tube 317.

In FIGS. 3A & 3B, a closed-loop cooling system is illustrated which incorporates a number of components that ensure that the cooling system works reliably. These include, but are not necessarily limited to: a coolant reservoir; coolant level sensors; a coolant expansion region; one or more vacuum breakers; one or more pressure-relieve valves; a pumping assembly which may include multiple modular pumping units; distribution and return manifolds for pump flow through one or more parallel-coupled pumping units of the pump assembly; check valves to prevent back flow through one or more inactive pumps of the pump assembly; a separate de-aerator facility to remove air or other gasses from the coolant within the cooling system; a supply manifold to distribute coolant to multiple cooling structures coupled in parallel; a coolant supply manifold; a return manifold to receive exhaust coolant from the multiple cooling structures; a heat removal section or mechanism, such as a coolant-to-air heat exchanger; and fill and drain ports for filling and draining the cooling system.

In one implementation, the above-noted components of the cooled electronic assembly, and in particular, the noted components of the cooling system, may be discrete components obtained, at least in part, as commercially available components. However, implementing the cooling system in this manner may add cost, space, and complexity to the cooling system, as well as to the resultant cooled electronic assembly. In accordance with aspects of the present invention, many of the above-noted structures or functions may be integrated (or combined) within a single, novel, multifunction coolant manifold structure.

For instance, in one embodiment, the multifunction coolant manifold structure may include or provide: a coolant reservoir; one or more coolant level sensors; a coolant expansion region; one or more vacuum breakers to prevent pump cavitation; one or more pressure-relief valves to ensure the cooling system does not over-pressurize; a distribution manifold to distribute coolant to the pumping assembly; a de-aerator facility to remove air and other gasses from the coolant within the cooling system; a coolant-commoning manifold to common exhaust coolant from multiple cooling structures; as well as one or more fill or drain ports for the cooling system. Advantageously, combining components of the cooling system into a single, multipurpose manifold structure saves cost, reduces space, and reduces complexity of the cooling system, as well as of the resultant cooled electronic assembly.

Generally stated, disclosed herein are cooling systems, cooled electronic assemblies, and methods of fabrication, which include a multifunction coolant manifold structure. For instance, the cooling system may include a coolant supply manifold, a multifunction coolant manifold structure, and multiple cooling structures. The multifunction coolant manifold structure includes, in one embodiment, a coolant-commoning manifold and an auxiliary coolant reservoir, which may be disposed above and in fluid communication with the coolant-commoning manifold. The multiple cooling structures are coupled in parallel fluid communication between the coolant supply manifold and the coolant-commoning manifold to receive coolant from the coolant supply manifold, and exhaust coolant to the coolant-commoning manifold. The coolant-commoning manifold is sized to slow a flow rate of coolant exhausting from the multiple cooling structures to allow gas within the exhausting coolant to escape the coolant within the coolant-commoning manifold. The multifunction coolant manifold structure is configured for the escaping gas (e.g., air bubbles) to rise to the auxiliary coolant reservoir, and be replaced within the coolant-commoning manifold by coolant from the auxiliary coolant reservoir.

In certain implementations, the multifunction coolant manifold structure is a single, integrated and rigid structure, where the auxiliary coolant reservoir is integrated with the coolant-commoning manifold. In this configuration, the coolant-commoning manifold may have a larger dimension in a first direction, such as the vertical direction, compared with that of the auxiliary coolant reservoir, which may have a larger dimension in a second direction, such as the horizontal direction. Thus, in one embodiment, the coolant-commoning manifold may be an elongate, vertical manifold, and the auxiliary coolant reservoir may have a larger cross-sectional area in a horizontal direction to accommodate additional coolant.

In certain implementations, the auxiliary coolant reservoir is coupled in fluid communication with the coolant-commoning manifold via a detachable coolant conduit or hose. In this configuration, the coolant-commoning manifold may be the same size as, or have a larger volume than, the auxiliary coolant reservoir. Alternatively, in one or more implementations, the auxiliary coolant reservoir may have a larger volume of coolant than the coolant-commoning manifold. Also note that, in one or more embodiments, the coolant-commoning manifold may have a coolant volume twice or larger the size of the coolant volume of the coolant supply manifold of the cooling system.

In certain embodiments, the multifunction coolant manifold structure includes a detachable, field-replaceable unit, which comprises the auxiliary coolant reservoir. Further, the field-replaceable unit may include one or more components for at least one of monitoring or controlling one or more characteristics of coolant within the multifunction coolant manifold structure. By way of example, the one or more components may include one or more coolant level sensors (for sensing a level of coolant within the manifold structure); one or more vacuum breakers (to prevent cavitation within the pumping assembly of the cooling system); and/or one or more pressure-relief valves (to ensure that the cooling system does not over-pressurize), etc. Advantageously, by associating these components with the field-replaceable unit, the one or more components may be readily removed for servicing or replacement by simply exchanging out the field-replaceable unit of the multifunction coolant manifold structure. Further, by sizing the coolant-commoning manifold as discussed herein, and by locating the field-replaceable unit above the coolant-commoning manifold, the field-replaceable unit may be replaced while the cooling system is operational, that is, while coolant continues to be pumped through the cooling system to cool the electronic systems. This can be accomplished, in part, by utilizing quick disconnect couplings in association with the detachable coolant conduit coupling the auxiliary coolant reservoir to the coolant-commoning manifold.

In one or more embodiments, a pumping assembly is provided to circulate coolant through the cooling system, where the pumping assembly is coupled in fluid communication to the multifunction coolant manifold structure via one or more coolant distribution connections. In this implementation, the multifunction coolant manifold structure includes both the coolant-commoning manifold and a coolant distribution manifold portion in a single, rigid manifold structure. In certain embodiments, the pumping assembly includes multiple coolant pumps (such as two or more modular pumping units (MPUs)), coupled in parallel fluid communication to the multifunction coolant manifold structure for selectively pumping coolant in parallel from the multifunction coolant manifold structure. The multiple coolant pumps facilitate continued operation of the cooling system. In operation, only one pumping unit may (depending on the mode) be active at a time, with modular pumping unit (MPU) redundancy allowing for, for example, servicing or replacement of an inactive modular pumping unit from the cooling system, without requiring shut-off of the electronic systems or electronics rack being cooled. By way of specific example, quick connect couplings may be employed, along with appropriately sized and configured hoses to couple, for example, the multifunction coolant manifold structure, pumping assembly, heat removal section, and coolant supply manifold, as well as the multiple cooling structures associated with the electronic systems to be cooled.

In certain embodiments, the auxiliary coolant reservoir incorporates a coolant expansion region in an upper portion thereof, and a coolant fill port disposed below a top of the auxiliary coolant reservoir, which assists in defining an air pocket in the upper portion of the reservoir as the coolant expansion region. In one or more implementations, the auxiliary coolant reservoir further includes one or more vacuum breakers to prevent cavitation within the cooling system, and/or one or more pressure-relief valves to prevent the cooling system from over-pressurizing. Further, in certain implementations, the auxiliary coolant reservoir may have one or more coolant level sensors associated therewith to sense a level of coolant within the reservoir, or more generally, within the multifunction coolant manifold structure.

Figure 4:
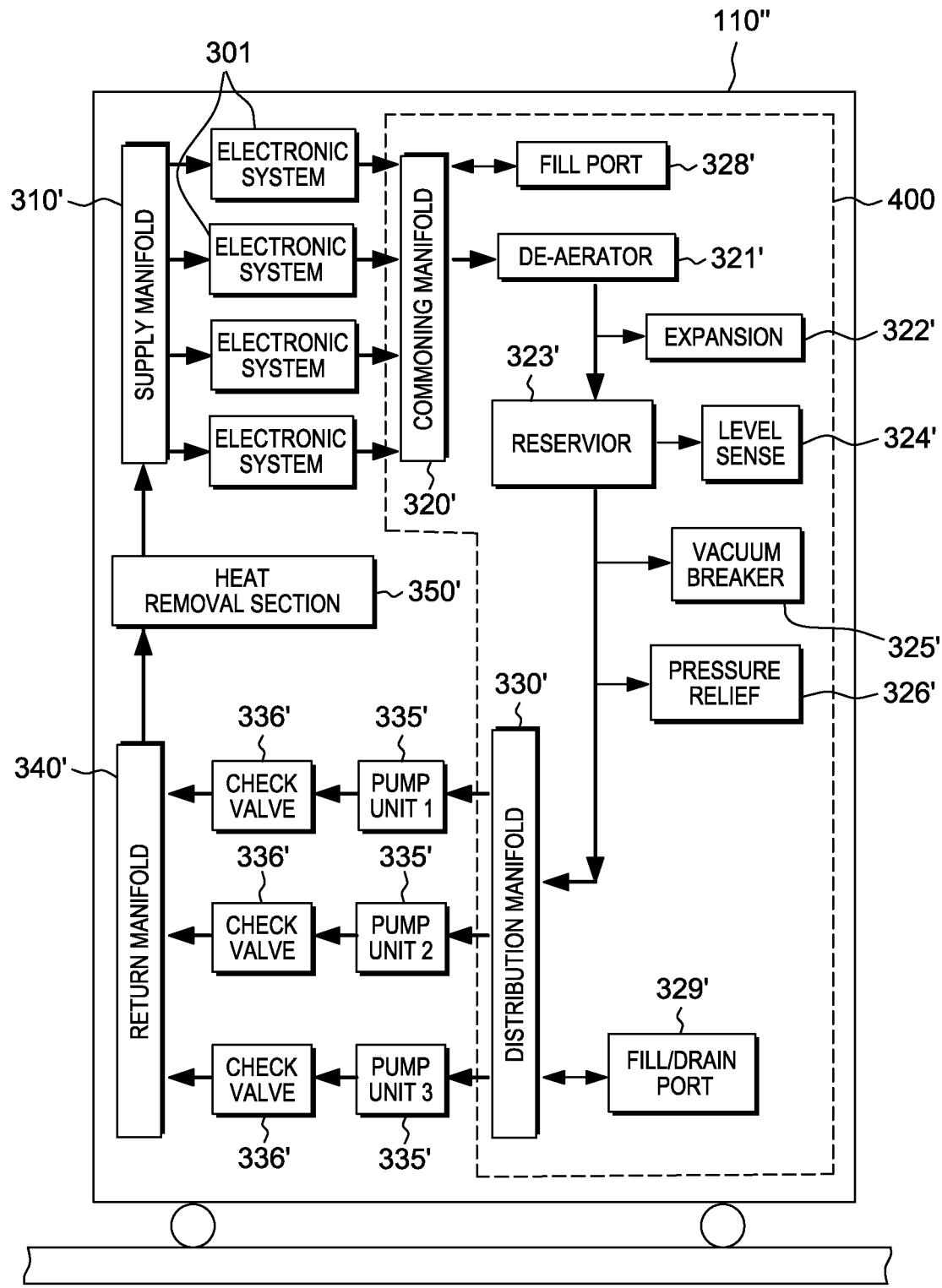
FIG. 4 is a schematic of another embodiment of a cooled electronics assembly having multiple electronic systems and a cooling system, in accordance with one or more aspects of the present invention.

FIG. 4 is a schematic depiction of one embodiment of a cooled electronic assembly configured as a cooled electronics rack 110", similar to the above-described cooled electronics rack 110' of FIGS. 3A & 3B. One significant difference in the assembly configuration of FIG. 4, however, is the provision of a multifunction coolant manifold structure 400, which integrates many of the functions and components described above in connection with the cooling system provided for the cooled electronic assembly of FIGS. 3A & 3B. In particular, as illustrated in FIG. 4, the multifunction coolant manifold structure 400 is shown to include, in one embodiment, a coolant-commoning manifold 320', a de-aerator facility 321', a coolant expansion region 322', a coolant reservoir 323', one or more coolant level sensors 324', one or more vacuum breakers 325', one or more pressure-relieve valves 326', a distribution manifold 330' for the pump assembly, as well as one or more fill or drain ports 328', 329'. As described further below in connection with the embodiments of FIGS. 5A-6B, these components are differently configured, however, and/or alternately implemented in comparison to the discrete components employed in the cooling system described above in connection with FIGS. 3A & 3B.

Figure 5A:
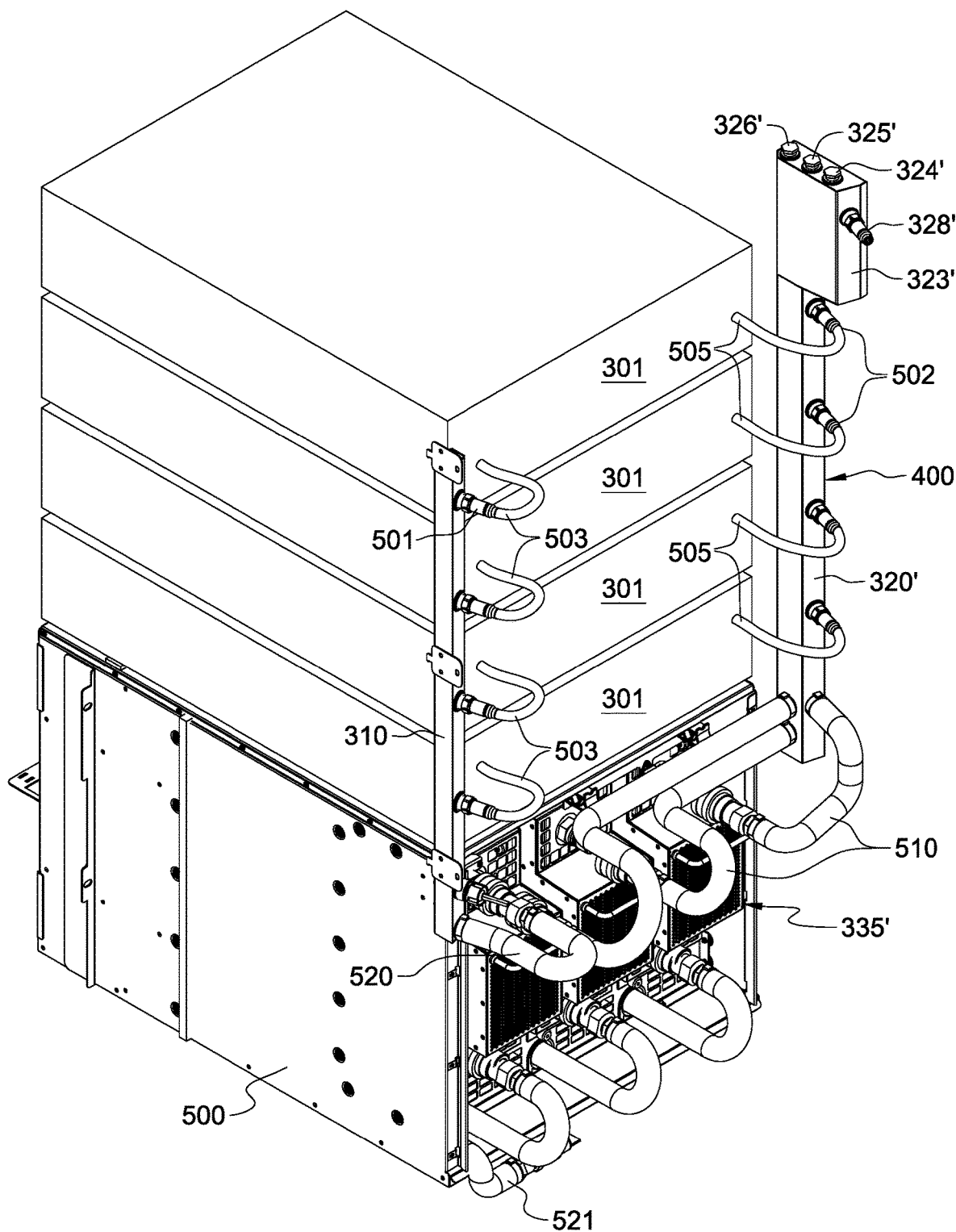
FIG. 5A depicts one detailed embodiment of a partially-assembled, cooled electronic assembly comprising multiple electronic systems and a cooling system, in accordance with one or more aspects of the present invention.
Figure 5B:
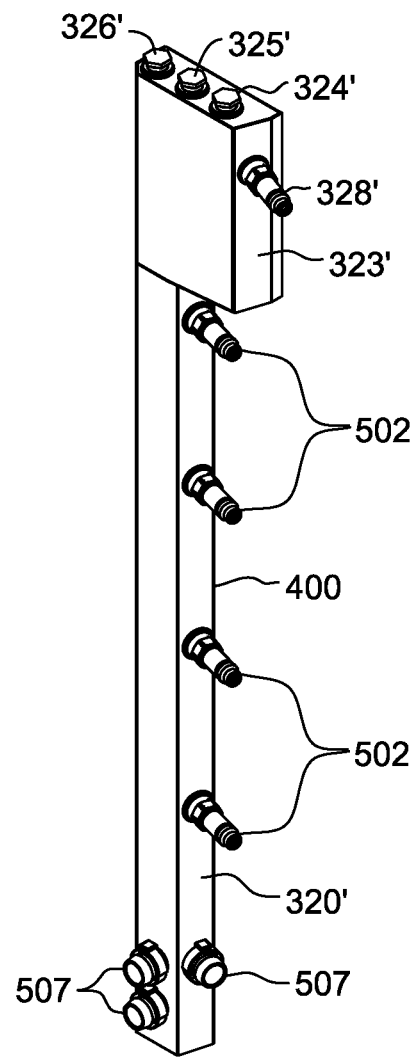
FIG. 5B is an enlarged depiction of one embodiment of the multifunction coolant manifold structure of the cooling system of FIG. 5A, in accordance with one or more aspects of the present invention.

By way of example, FIGS. 5A & 5B depict one detailed embodiment of a partial cooled electronic assembly, in accordance with one or more aspects of the present invention. In the depicted embodiment, the cooled electronic assembly includes a cooling system housing 500, which may be configured for disposition within, for instance, a lower portion of an electronics rack, such as within one or more of the above-described electronics racks. As illustrated, the cooled electronic assembly also includes multiple electronic systems 301 to be cooled. In the configuration of FIG. 5A, the electronic systems are shown (by way of example only) one above the other, above cooling system housing 500, as they might be positioned within an electronics rack. Note, however, that this particular configuration is presented as one example only. Electronic systems 301 each have associated therewith a cooling structure (not shown), such as a coolant-cooled heat sink, cold plate, immersion-cooling housing, etc., which facilitates extraction of heat from the respective electronic system, or from one or more electronic components within the respective electronic system.

As illustrated in FIG. 5A, the cooling system includes, in the depicted embodiment, a coolant supply manifold 310, which includes respective quick connect couplings 501 that facilitate connection of appropriately sized and configured hoses 503 to the coolant supply manifold 310, so as to couple in fluid communication the coolant supply manifold and the cooling structures associated with the electronic systems 301. Similar hoses 505 and quick connect couplings 502 are associated with the multifunction coolant manifold structure 400 of the cooling system for coupling the cooling structures associated with the electronics systems 301 in parallel fluid communication with manifold structure 400 as well.

As illustrated in FIG. 5A, the multifunction coolant manifold structure includes a coolant-commoning manifold 320' from which quick connect couplings 502 extend. In one embodiment, coolant-commoning manifold 320' is sized larger than coolant supply manifold 310 (e.g., 2× larger or greater in coolant volume) to, in part, slow a flow rate of coolant exhausting from the cooling structures associated with the electronic systems 301 as the coolant enters the coolant-commoning manifold 320'. This slowing of the coolant flow rate is designed so that entrained air or gas within the coolant is allowed to escape within the coolant-commoning manifold 320' and rise, in one embodiment, to an auxiliary coolant reservoir 323' located above the coolant-commoning manifold 320', and in fluid communication therewith.

In the example of FIGS. 5A & 5B, the multifunction coolant manifold structure 400 is a single, integrated and rigid structure, with the coolant-commoning manifold 320' and auxiliary coolant reservoir 323' in fluid communication within the integrated structure. As escaping air or gas rises to the auxiliary coolant reservoir 323' from the coolant-commoning manifold 320', it is replaced within the coolant-commoning manifold 320' by coolant from the auxiliary coolant reservoir 323'. That is, as air or gas rises, coolant drops from the auxiliary coolant reservoir 323' into the coolant-commoning manifold 320'. In this manner, the multifunction coolant manifold structure 400 inherently functions as a de-aerator. Further, a coolant expansion region is defined in an upper portion of auxiliary coolant reservoir 323' by providing, for instance, a coolant fill port 328' in association with the auxiliary coolant reservoir on a side of the reservoir, spaced below an upper-most (or top) of the auxiliary coolant reservoir 323'. In this manner, a volume of air (that is, an air pocket) is formed above the coolant fill port 328' within the auxiliary coolant reservoir. This volume of air advantageously allows for safe expansion and contraction of the coolant within the cooling system due, for instance, to changing temperatures or pressures.

As illustrated in FIGS. 5A & 5B, the multifunction coolant manifold structure 400, and in particular, the auxiliary coolant reservoir 323' portion thereof, includes connections for one or more components to at least one of monitor or control one or more characteristics of the coolant within the multifunction coolant manifold structure. These one or more components may include, for instance, one or more coolant level sensors 324' for sensing level of coolant within the multifunction coolant manifold structure 400, and reporting the level to a cooling system controller (not shown) for use in possible control action. For instance, should the level of coolant within the multifunction coolant manifold structure drop to an unacceptably low level, the level sensor(s) 324' signals could be employed by the controller to signal a service operator to add coolant to the system. Alternatively, depending on the sensed level, the controller could automatically shut the cooling system down, and depending on the implementation, possibly shut the electronic systems down as well. This might depend, for instance, on whether backup cooling, such as backup airflow cooling, is integrated within the cooled electronic assembly. Additionally, the component connections may allow for connections of one or more vacuum breakers 325', and/or one or more pressure-relief valves 326', as described above.

As shown in the figures, the multifunction coolant manifold structure 400 further includes a coolant distribution manifold portion with coolant distribution connections 507 (FIG. 5B), which allow coolant hoses 510 (FIG. 5A) to couple to the manifold structure to receive coolant from the multifunction coolant manifold structure for distribution to multiple pumping units, such as the above-described modular pumping units. In the embodiment of FIG. 5A, three modular pumping units 335' are illustrated by way of example only, each receiving (via the respective hose connections 507) coolant from the multifunction coolant manifold structure. In one implementation, the parallel-coupled pumping units 335' operate to independently pump coolant through a return manifold to a heat removal section (as described above), which may also be disposed within the cooling system housing 500, for instance, behind the depicted pumping units 335'. In one implementation, the heat removal section may comprise one or more coolant-to-air heat exchangers, with air being drawn through the cooling system housing 500 via one or more fan mechanisms, which in one embodiment, may also be disposed within the housing, for instance, behind the one or more coolant-to-air heat exchangers. In an alternate embodiment, the heat removal section could include one or more liquid-to-liquid heat exchangers to reject heat from the coolant circulating through the cooling system to, for instance, facility-chilled liquid, such as building-chilled water. The heat removal section is coupled to coolant supply manifold 310 via a hose 520 and appropriate connections.

As illustrated in FIG. 5A, the cooling system may include, in one embodiment, a coolant drain hose 521 coupled in fluid communication with the heat removal section and disposed at a lower-most portion of the cooling system to facilitate selective draining of coolant from the cooling system, or filling of coolant into the cooling system, depending on the current life stage of the system. An appropriate quick connect coupling may be provided at the end of drain hose 521 to facilitate the operation.

Note that FIGS. 5A & 5B depict one embodiment only of an multifunction coolant manifold structure 400, configured as an integrated structure, wherein the above-described components or facilities are advantageously integrated into a common, multipurpose structure. By way of example, the multifunction coolant manifold structure may be fabricated of a single, punched, stainless steel sheet metal stamping, which is bent into the appropriate shape and robotically welded to arrive at the desired structure. The illustrated manifold structure 400 is used to common the exhaust flow from the parallel-coupled cooling structures associated with the electronic systems. In one implementation, these could be parallel computer nodes or server nodes of an electronics rack, with four electronic systems being illustrated in FIGS. 5A & 5B, by way of example only.

As noted, the upper portion of the multifunction coolant manifold structure is advantageously configured as an auxiliary coolant reservoir. In one or more implementations, the cross-sectional area of the auxiliary coolant reservoir 323' is larger than the cross-sectional area of the coolant-commoning manifold 320'. In particular, in the depicted implementation, the coolant-commoning manifold 320' has a larger dimension in a first, vertical direction compared with that of the auxiliary coolant reservoir 323', but that the auxiliary coolant reservoir 323' has a larger horizontal dimension in a second direction compared with that of the coolant-commoning manifold 320'. Note that the specific configuration of auxiliary coolant reservoir 323' is presented by way of example only. The size and configuration of the multifunction coolant manifold structure may depend, in part, on the available size within the associated electronics assembly or electronics rack to which the cooling system provides cooling.

Note that, in one embodiment, the coolant-commoning manifold 320' cross-section is made larger than normally required to carry the coolant flow (for instance, 2× or larger) in order to allow the returning, exhausting coolant to slow down, allowing air and other gas in the coolant to de-aerate, or come out of solution, within the coolant-commoning manifold, with any gas bubbles rising to the auxiliary coolant reservoir portion at the top of the manifold structure, while coolant from the reservoir replaces the gas bubbles from the coolant-commoning manifold. Note that the multifunction coolant manifold structure further may incorporate, for example, in association with the auxiliary coolant reservoir, one or more level sensors, to allow the cooling system controller to know the current coolant level state, and take or signal for action, if required.

Additionally, features or connections may be provided in the multifunction coolant manifold structure, such as, in association with the auxiliary coolant reservoir (in one embodiment), to facilitate installing vacuum breakers 325' and/or pressure-relief devices 326'. The vacuum breaker(s) ensures that the auxiliary coolant reservoir is near atmospheric or slightly negative pressure. This feature may be employed to prevent the pumps from cavitating due to a negative pressure in the system. The pressure-relief valves may be provided as a safety feature. These devices and valves are placed, in one embodiment, in the auxiliary coolant reservoir, at the highest coolant location within the cooling system. This ensures that, even if the devices fail in an open state, no coolant will escape since the coolant is under little or no pressure within the multifunction coolant manifold structure. During normal operation, the devices can fail in place, and not cause any functional problems with the cooling system disclosed herein. The component(s) can also be safely removed while the cooling system is operational. Note that in the embodiment of FIGS. 5A & 5B, the vacuum breaker devices 325' and pressure-relief valves 326' are located in the upper-most portion of the auxiliary coolant reservoir 323'.

Mounting brackets may be provided to facilitate convenient mounting of the coolant supply manifold and multifunction coolant manifold structure into the electronics rack or frame. Filling and draining of the cooling system is facilitated by providing one or more fill or drain ports in association with the multifunction coolant manifold structure. In the embodiment of FIG. 5A, a fill or drain port 328' is provided in association with the auxiliary coolant reservoir 323'. This, along with the discharge hose 521 (FIG. 5A) may be used to fill the cooling system. For instance, the quick connect coupling at the end of drain hose 521 may be engaged to pump coolant into the cooling system, and the port 328' associated with the reservoir may be used to vent air during the filling operation. During draining, the procedure may be reversed, with air being allowed in through port 328' as coolant drains from drain hose 521. In one implementation, the multifunction coolant manifold structure is filled with coolant, as is the rest of the cooling system, prior to starting the pumping assembly. The reservoir 323' is, in one implementation, sized with a sufficient volume of coolant to ensure that if an unfilled cooling structure associated with one of the electronics systems is connected to the cooling system during operation, that there will be sufficient coolant within the cooling system to continue operation. Note that in the embodiment presented, a large volume of coolant exists above the multiple parallel-coupled pumps, ensuring a good source of coolant to prime the pumping units.

Figure 6A:
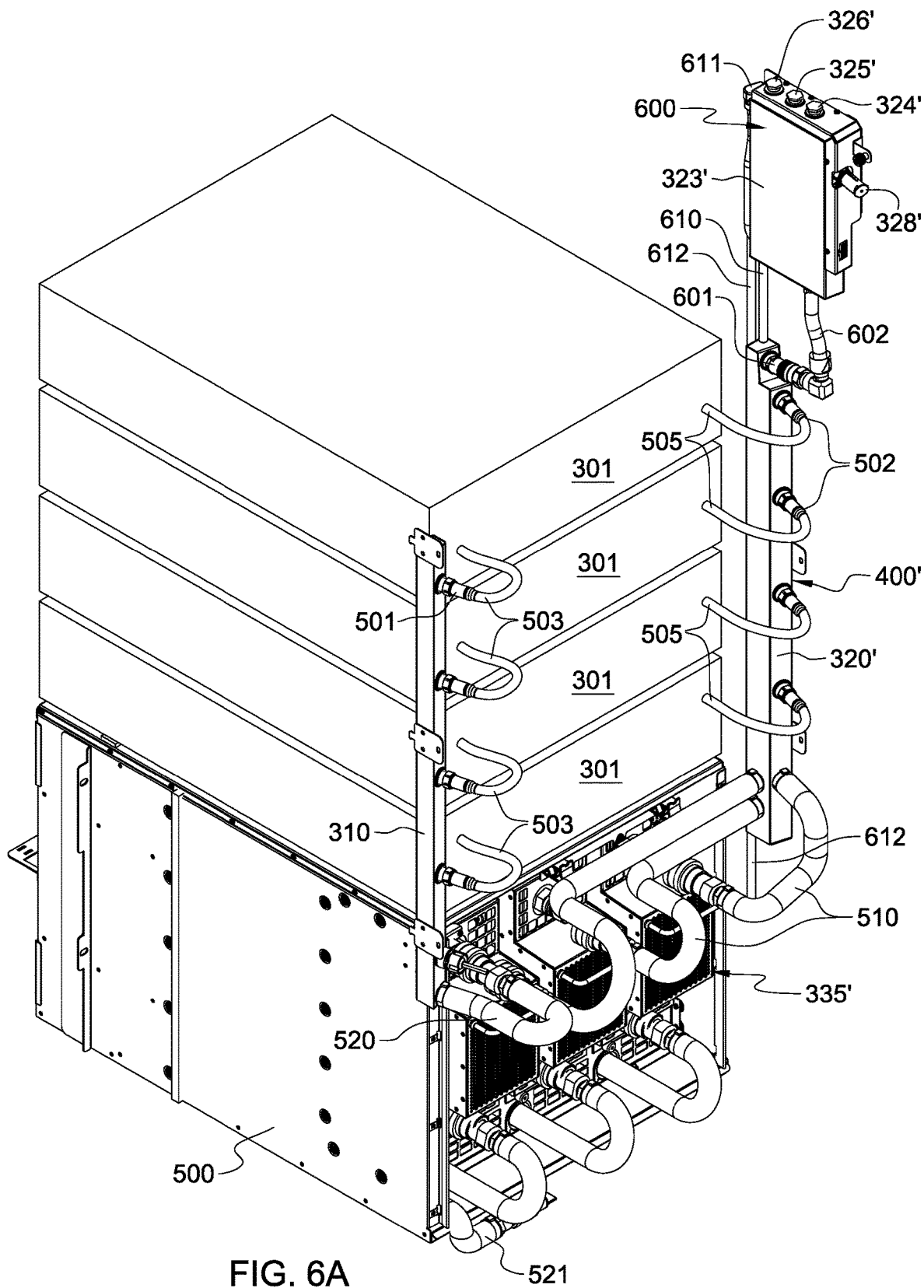
FIG. 6A depicts another embodiment of a partially-assembled, cooled electronic assembly comprising multiple electronic systems and a cooling system, in accordance with one or more aspects of the present invention.
Figure 6B:
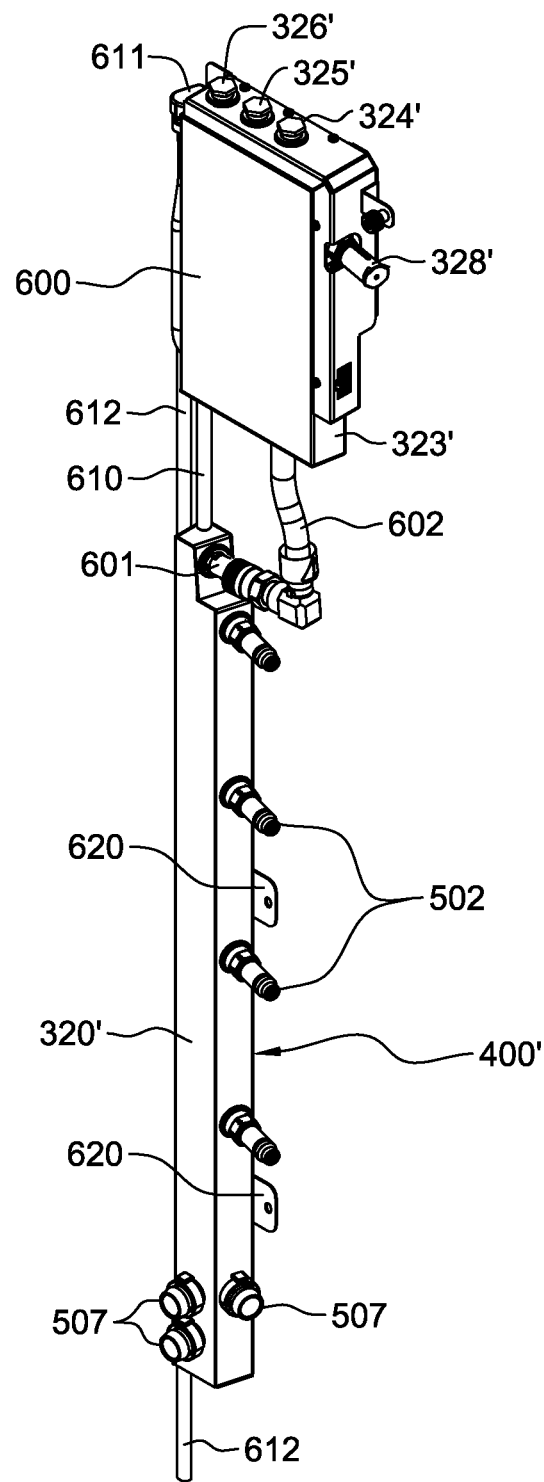
FIG. 6B is an enlarged depiction of one embodiment of the multifunction coolant manifold structure of the cooling system of FIG. 6A, in accordance with one or more aspects of the present invention.

By way of further example, FIGS. 6A & 6B depict an alternate embodiment of a partial cooled electronic assembly, in accordance with one or more aspects of the present invention. In this embodiment, the cooled electronic assembly includes cooling system housing 500 configured and disposed as described above in connection with FIGS. 5A & 5B.

Electronic systems 301 each have associated therewith a cooling structure, such as a coolant-cooled heat sink, cold plate, immersion-cooling housing, etc., which facilitates extraction of heat from the respective electronic system, or from one or more electronic components within the electronic system, to coolant flowing through the cooling structure. The cooling structures associated with electronic systems 301 are coupled in parallel between coolant supply manifold 310 and multifunction coolant manifold structure 400'. In particular, respective quick connect couplings 501 facilitate connection of appropriately sized and configured hoses 503 to coolant supply manifold 310, so as to couple in fluid communication the coolant supply manifold and the cooling structures associated with the electronic systems. Similar hoses 505 and quick connect couplings 502 are associated with multifunction coolant manifold structure 400' of the cooling system for coupling the cooling structures associated with the electronic systems 301 in parallel fluid communication with coolant-commoning manifold 320', as illustrated.

As in the embodiment of FIGS. 5A & 5B, coolant-commoning manifold 320' is sized larger (for example, 2× or greater coolant volume) than coolant supply manifold 310 to, in part, slow a flow rate of coolant exhausting from the cooling structures associated with electronic systems 301 as the coolant enters the coolant-commoning manifold 320'. This slowing of the coolant flow rate is configured or designed so that entrained air or gas within the coolant is allowed to escape the coolant within the coolant-commoning manifold 320', and rise, in one embodiment, to a detachable, field-replaceable unit 600 comprising auxiliary coolant reservoir 323'. In the embodiment illustrated, field-replaceable unit 600 is located above the coolant-commoning manifold 320', and in fluid communication therewith via, for instance, one or more hose connections 601 and an appropriately sized and configured detachable coolant conduit 602 coupling, for instance, an upper portion of coolant-commoning manifold 320' to a lower portion of auxiliary coolant reservoir 323', as illustrated in FIGS. 6A & 6B.

In the example of FIGS. 6A & 6B, the multifunction coolant manifold structure 400' comprises, in part, coolant-commoning manifold 320' and the separate field-replaceable unit 600, which includes the auxiliary coolant reservoir 323'. The two structures are in fluid communication via detachable coolant conduit 602. Thus, as escaping air or gas rises to the auxiliary coolant reservoir 323' from the coolant-commoning manifold 320', it is replaced within the coolant-commoning manifold 320' by coolant from the auxiliary coolant reservoir 323'. That is, as air or gas rises, coolant drops from the auxiliary coolant reservoir 323' in the field-replaceable unit 600 into the coolant-commoning manifold 320'. Thus, the multifunction coolant manifold structure 400' is sized and configured to inherently function as a de-aerator. Further, a coolant expansion region is defined in an upper portion of auxiliary coolant reservoir 323' by providing, for instance, coolant fill port 328' in association with the auxiliary coolant reservoir 323' on a side of the reservoir, spaced below an upper-most (or top) of the auxiliary coolant reservoir 323'. In this manner, a volume of air (that is, an air pocket) is formed above the coolant fill port 328' within the auxiliary coolant reservoir. This volume of air allows for safe expansion and contraction of the coolant within the multifunction coolant manifold structure, and more generally, within the cooling system, due, for instance, to changing temperatures or pressures.

As illustrated in FIGS. 6A & 6B, multifunction coolant manifold structure 400', and in particular, field-replaceable unit 600 thereof, includes connections for one or more components to monitor or control one or more characteristics of the coolant within the multifunction coolant manifold structure. These one or more components may include, for instance, one or more coolant level sensors 324' for sensing level of coolant within the multifunction coolant manifold structure 400', and reporting the level to a cooling system controller (not shown) for use in possible control action, as described above in connection with FIGS. 5A & 5B. Additionally, the component connections may allow for connections of one or more vacuum breakers 325', and/or one or more pressure-relief valves 326', as described above. In an alternate, or further implementation, a pressure-relief valve 611 may be provided on the end of a conduit 610, which extends from coolant-commoning manifold 320' along the side of field-replaceable unit 600, but not in fluid communication therewith. If an excessive pressure event occurs, coolant may pass up conduit 610, and through pressure-relief valve 611, into a second conduit 612, which connects from the pressure-relief valve and directs the exhausting coolant to the bottom of the cooled electronic assembly, such as to the bottom of the electronics rack. Thus, any coolant released during the pressure event will safely discharge through the conduits 610 & 612, in one implementation.

Advantageously, by associating one or more monitoring or control components 324', 325', 326' with the field-replaceable unit, the components may be readily removed from the multifunction coolant manifold structure by simply replacing the field-replaceable unit 600 coupled via respective quick connect couplings and conduit 602 to coolant-commoning manifold 320'. Further, by coupling the field-replaceable unit above the coolant-commoning manifold, the field-replaceable unit may be replaced while the cooling system is operational, with coolant exhausting from the multiple cooling structures to the coolant-commoning manifold 320' of the multifunction coolant manifold structure 400'.

As in the embodiment of FIGS. 5A & 5B, the multifunction coolant manifold structure 400' further includes a coolant distribution manifold portion with coolant distribution connections 507 (FIG. 6B), which allow coolant hoses 510 (FIG. 6A) to couple to the manifold structure to receive coolant therefrom for distribution to multiple pumping units 335', such as described above. Note that in the embodiment of FIG. 6A, three modular pumping units 335' are illustrated by way of example only, with each receiving, via respective hose connection 507, coolant from the multifunction coolant manifold structure. In one implementation, the parallel-coupled pumping units 335' operate to independently pump coolant through a return manifold (not shown) to a heat removal section (as described above), which may also be disposed within cooling system housing 500, for instance, behind the depicted pumping units 335'. In one implementation, the heat removal section includes one or more coolant-to-air heat exchangers, with air being drawn through the cooling system housing 500 via one or more fan mechanisms, which in one embodiment, may also be disposed within the housing, for instance, behind the one or more coolant-to-air heat exchangers. In an alternate embodiment, the heat removal section could include one or more liquid-to-liquid heat exchangers to reject heat from the coolant circulating through the cooling system to, for instance, facility-chilled liquid, such as building-chilled water. The heat removal section may be coupled to coolant supply manifold 310 via hose 520 and appropriate connections.

As with the embodiment of FIGS. 5A & 5B, the cooling system of FIGS. 6A & 6B may include coolant drain hose 521 coupled in fluid communication with the heat removal section and disposed at a lower-most portion of the cooling system to facilitate selective draining of coolant from the cooling system, or filling of coolant into the cooling system, depending on the current life stage of the system. Appropriate quick connect couplings may be provided in association with drain hose 521 to facilitate the operation.

By way of example, the coolant-commoning manifold structure 320' and the field-replaceable unit 600 may each be fabricated of a single, punched, stainless steel sheet metal stamping, which is bent into the appropriate shape and robotically welded to arrive at the desired structure. The illustrated manifold structure 400', and in particular, the coolant-commoning manifold 320', is used to common the exhaust flow from the parallel-coupled cooling structures associated with the electronic systems. In one implementation, these could be parallel computer nodes or server nodes of an electronics rack, with four electronic systems of FIG. 6A being illustrated, by way of example only.

In certain applications, the height of the coolant electronic assembly, or more particularly, the height of the electronics rack, may be too tall for a particular customer facility, and in particular, too tall for a particular customer door opening. Thus, a height reduction to the electronics rack may be required, and in such a case, the multifunction coolant manifold structure of FIGS. 6A & 6B may be advantageously employed, where a detachable conduit and quick connect couplings provide the fluid connection between the coolant-commoning manifold and the auxiliary coolant reservoir of the multifunction coolant manifold structure.

In one or more implementations, the cross-sectional area of the auxiliary coolant reservoir 323' is significantly larger than the cross-sectional area of the coolant-commoning manifold 320'; that is, taken transversely through the respective structures. In the depicted implementation, coolant-commoning manifold 320' has a larger vertical dimension compared with that of the auxiliary coolant reservoir 323', but the auxiliary coolant reservoir 323' has, by way of example, a larger horizontal dimension in a second direction compared with that of the coolant-commoning manifold 320'. Note that the specific configuration of the auxiliary coolant reservoir 323' of FIGS. 6A & 6B is presented by way of example only. The size and configuration of the field-replaceable unit of the multifunction coolant manifold structure may depend, in part, on the available size within the associated electronics assembly or electronics rack to which the cooling system provides cooling.

Note that the coolant-commoning manifold 320' cross-section is made larger than normally required in order to allow the returning coolant to slow down, allowing air and other gas in the coolant to de-aerate, or come out of solution, within the coolant-commoning manifold, with the gas bubbles rising to the auxiliary coolant reservoir portion of the multifunction coolant manifold structure via the conduit 602, while coolant from the reservoir replaces the gas bubbles within the coolant-commoning manifold. Advantageously, removal of air or other gas enhances effectiveness of the coolant since cooling of the electronic systems is related to the mass flow rate of the coolant.

As noted, the multifunction coolant manifold structure may further incorporate, for example, in association with the field-replaceable unit, one or more level sensors 324' to allow the cooling system controller to know the current coolant level state, and take or signal for action, if required. Additional features or connections may be provided in the field-replaceable unit to facilitate installing vacuum breakers 325' and/or pressure-relief devices 326'. Alternatively, a pressure-relief valve 611 may be provided as described above in connection with FIGS. 6A & 6B. These devices and valves are placed, in one embodiment, at the highest coolant location within the cooling system. This ensures that, even if the device or valve should fail in an open state, no coolant will escape since the coolant is under little or no pressure within the multifunction coolant manifold structure. During normal operation, the device or valve can fail in place, and not cause any functional problems within the cooling system. The component(s) can also be safely removed in association with the field-replaceable unit, while the cooling system is operational.

Mounting bracket 620 may be provided in association with multifunction coolant manifold structure 400' for convenient mounting of the multifunction coolant manifold structure within a frame or rack. Filling and draining of the cooling system is facilitated by providing one or more fill or drain ports 328' in association with the multifunction coolant manifold structure. In the embodiment of FIGS. 6A & 6B, a fill or drain port 328' is provided in association with the field-replaceable unit 600. This, along with discharge hose 521, may be used to fill the cooling system or drain the cooling system, in a manner as described above in connection with the embodiment of FIGS. 5A & 5B.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   providing a cooling system, the providing of the cooling system including:
   providing a coolant loop comprising a coolant and a coolant pumping assembly;
   providing a heat exchange assembly coupled to the coolant loop to cool coolant within the coolant loop;
   providing a coolant supply manifold coupled to the coolant loop;
   providing a multifunction coolant manifold structure to deaerate the coolant, the multifunction coolant supply manifold structure being coupled to the coolant loop and being separate from the heat exchange assembly, the multifunction coolant supply manifold structure including:
   a coolant-commoning manifold;
   an auxiliary coolant reservoir disposed above and in fluid communication with the coolant-commoning manifold; and
   a coolant fill port within the auxiliary coolant reservoir, below a top of the auxiliary coolant reservoir to assist in defining a gas pocket in an upper portion thereof as a coolant expansion region;
   providing multiple cooling structures coupled to the coolant loop in parallel fluid communication between the coolant supply manifold and the coolant-commoning manifold to receive coolant from the coolant supply manifold, and exhaust coolant to the coolant-commoning manifold;
   the multifunction coolant manifold structure comprising both the coolant-commoning manifold and a coolant distribution manifold portion integrated together in a single structure, and wherein the multifunction coolant manifold structure is sized larger than the coolant supply manifold; and
   wherein the multifunction coolant manifold structure deaerates the coolant by the coolant-commoning manifold being sized larger than the coolant supply manifold to slow therein a flow rate of coolant exhausting from the multiple cooling structures as the coolant enters the coolant-commoning manifold to allow gas within the exhausting coolant to escape the coolant within the coolant-commoning manifold, the escaping gas within the coolant-commoning manifold rising to the auxiliary coolant reservoir, and being replaced within the coolant-commoning manifold by coolant from the auxiliary coolant reservoir.

2. The method of claim 1, wherein the coolant pumping assembly comprises at least two modular pumping units coupled in parallel fluid communication to the multifunction coolant manifold structure for pumping coolant in parallel from the multifunction coolant manifold structure.

3. The method of claim 2, wherein the multifunction coolant manifold structure is a single, integrated and rigid structure, and wherein the coolant-commoning manifold has a larger dimension in a first direction compared with that of the auxiliary coolant reservoir, and the auxiliary coolant reservoir has a larger dimension in a second direction compared with that of the coolant-commoning manifold.

4. The method of claim 3, wherein the first direction is a vertical direction, and the second direction is a horizontal direction.

5. The method of claim 2, wherein the auxiliary coolant reservoir is coupled in fluid communication with the coolant-commoning manifold via a detachable coolant conduit.

6. The method of claim 5, wherein the multifunction coolant manifold structure comprises a field-replaceable unit, the field-replaceable unit comprising the auxiliary coolant reservoir, and including one or more components for at least one of monitoring or controlling one or more characteristics of the coolant within the multifunction coolant manifold structure.

7. The method of claim 6, wherein the multifunction coolant manifold structure is configured for the field-replaceable unit to be replaceable while the cooling system is operational, with coolant exhausting from the multiple cooling structures to the coolant-commoning manifold of the multifunction coolant manifold structure.

8. The method of claim 1, wherein the auxiliary coolant reservoir further comprises a vacuum breaker to prevent cavitation within the cooling system, and a pressure-relief valve to prevent the cooling system from over-pressurizing.

9. The method of claim 1, further comprising providing one or more coolant level sensors associated with the auxiliary coolant reservoir to sense level of coolant within the multifunction coolant manifold structure.

* * * * *